(12) United States Patent
Putnik et al.

(10) Patent No.: US 10,836,629 B2
(45) Date of Patent: Nov. 17, 2020

(54) MICROMECHANICAL SPRING STRUCTURE

(71) Applicant: Robert Bosch GmbH, Stuttgart (DE)

(72) Inventors: Martin Putnik, Reutlingen (DE); Stefano Cardanobile, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 108 days.

(21) Appl. No.: 16/154,267

(22) Filed: Oct. 8, 2018

(65) Prior Publication Data
US 2019/0106320 A1 Apr. 11, 2019

(30) Foreign Application Priority Data

Oct. 10, 2017 (DE) .......................... 10 2017 217 975

(51) Int. Cl.
*B81B 3/00* (2006.01)
*F16F 1/26* (2006.01)

(52) U.S. Cl.
CPC .......... *B81B 3/0035* (2013.01); *B81B 3/0072* (2013.01); *B81B 2201/02* (2013.01); *B81B 2201/0235* (2013.01); *B81B 2201/0242* (2013.01); *B81B 2203/0109* (2013.01); *B81B 2203/0118* (2013.01); *B81B 2203/0163* (2013.01); *B81B 2203/053* (2013.01); *F16F 1/26* (2013.01); *F16F 2230/0005* (2013.01); *F16F 2232/08* (2013.01); *F16F 2238/022* (2013.01)

(58) Field of Classification Search
CPC . B81B 3/0035; B81B 3/0072; B81B 2201/02; B81B 2201/0235; B81B 2201/0242; B81B 2203/0109; B81B 2203/0118; B81B 2203/0163; B81B 2203/053; F16F 1/26; F16F 2230/0005; F16F 2232/08; F16F 2238/022
USPC .......................................................... 73/504
See application file for complete search history.

(56) References Cited

U.S. PATENT DOCUMENTS

| | | | |
|---|---|---|---|
| 6,571,629 B1 | 6/2003 | Kipp et al. | |
| 6,742,390 B2 * | 6/2004 | Mochida ............ | G01C 19/5719 73/504.04 |
| 7,093,487 B2 * | 8/2006 | Mochida ............ | G01C 19/5719 73/504.14 |
| 7,514,853 B1 * | 4/2009 | Howe .................. | B81B 3/0072 310/315 |
| 8,567,248 B2 * | 10/2013 | Gotoh ................ | G01C 19/5719 73/504.15 |
| 2005/0109107 A1 * | 5/2005 | Park ...................... | G01C 19/56 73/504.16 |

(Continued)

FOREIGN PATENT DOCUMENTS

DE 102013208699 11/2014

*Primary Examiner* — Peter J Macchiarolo
*Assistant Examiner* — Monica S Young
(74) *Attorney, Agent, or Firm* — Norton Rose Fulbright US LLP; Gerard Messina

(57) ABSTRACT

A micromechanical spring structure, including a spring beam and a rigid micromechanical structure, the spring beam including a first end and an opposing second end along a main extension direction. The spring beam includes a fork having two support arms on at least one of the two ends, which is anchored to the rigid micromechanical structure, the two support arms being anchored to a surface of the rigid micromechanical structure, which extends perpendicular to the main extension direction of the spring beam.

12 Claims, 2 Drawing Sheets

(56) References Cited

U.S. PATENT DOCUMENTS

| | | | |
|---|---|---|---|
| 2006/0032306 A1* | 2/2006 | Robert | G01C 19/574 |
| | | | 73/504.02 |
| 2010/0024547 A1* | 2/2010 | Katsuki | G01C 19/5719 |
| | | | 73/504.12 |
| 2010/0300203 A1* | 12/2010 | Gotoh | G01C 19/5719 |
| | | | 73/504.15 |
| 2011/0174074 A1* | 7/2011 | Li | G01C 19/5755 |
| | | | 73/504.14 |
| 2012/0235537 A1* | 9/2012 | Masunaga | B81B 3/0072 |
| | | | 310/300 |
| 2015/0168437 A1* | 6/2015 | Jomori | G01P 3/44 |
| | | | 73/496 |
| 2016/0138667 A1 | 5/2016 | Pruetz et al. | |
| 2019/0169018 A1* | 6/2019 | Senkal | B81B 7/0045 |
| 2019/0345023 A1* | 11/2019 | Duerr | G02B 26/0833 |
| 2020/0025790 A1* | 1/2020 | Reinke | G01L 1/162 |

* cited by examiner

MICROMECHANICAL SPRING STRUCTURE

FIELD OF THE INVENTION

The present invention is directed to a micromechanical spring structure, including a spring beam and a rigid micromechanical structure, the spring beam including a first end and an opposing second end along a main extension direction.

BACKGROUND INFORMATION

Micromechanical rotation rate sensors contain one or multiple spring structures for the movement of the drive oscillation. The spring structures are generally connected to the substrate anchor. Additional springs in the rotation rate sensor connect multiple masses to one another. The connection of the spring structures to each element is direct and, as a result, may transmit lateral tensile forces. Lateral tensile forces in spring structures are the cause of mechanical non-linearity during operation of the sensor. Previously known measures provide for the optimization of spring structures in order to reduce mechanical non-linearities. Such optimized spring structures for micromechanical sensors are discussed in DE102013208699A1, U.S. Pat. No. 6,571,629B and US 2016/138667A. Modified substrate anchors or also modified connection to mass structures in order to relieve the spring structures and to reduce the mechanical non-linearity are not previously known.

SUMMARY OF THE INVENTION

The object of the present invention is to provide a robust micromechanical spring structure having reduced mechanical non-linearity.

The present invention is directed to a micromechanical spring structure, including a spring beam and a rigid micromechanical structure, the spring beam including a first end and an opposing second end along a main extension direction. The core of the present invention is that the spring beam includes a fork on at least one of the two ends, having support arms, which is anchored to the rigid micromechanical structure, the two support arms being anchored to a surface of the rigid micromechanical structure, which extends perpendicular to the main extension direction of the spring beam. Tensile stresses and compression stresses, which occur during direct suspension, are advantageously reduced by the fork and the frame structure formed as a result.

One advantageous embodiment of the present invention provides that the rigid micromechanical structure is a substrate anchor. Another advantageous embodiment of the present invention provides that the rigid micromechanical structure is a movable structure, in particular, a seismic mass. One advantageous embodiment of the present invention provides that the fork forms a rectangular frame. Another advantageous embodiment of the present invention provides that the fork forms a semicircular or elliptical frame.

DETAILED DESCRIPTION

Figure 1:
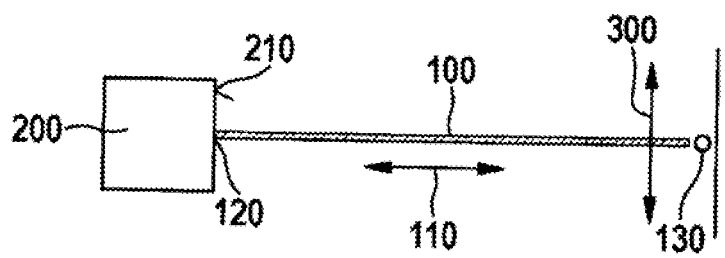
FIG. 1 shows a first micromechanical spring structure, including a spring beam and a rigid micromechanical structure in the related art.

FIG. 1 shows a first micromechanical spring structure, including a spring beam and a rigid micromechanical structure in the related art. Spring beam 100 includes a first end 120 and an opposing second end 130 along a main extension direction 110. First end 120 of spring beam 100 is anchored to a surface 210 of rigid micromechanical structure 200. Surface 210 extends perpendicular to main extension direction 110 of the spring beam. Second end 130 of spring beam 100 is deflectable in a direction 300, which extends in parallel to surface 210. Spring beam 100 bends as a result. The device shown is a micromechanical structure above the surface of a substrate. Rigid micromechanical structure 200 is configured as a substrate anchor and essentially does not deform.

Figure 2:
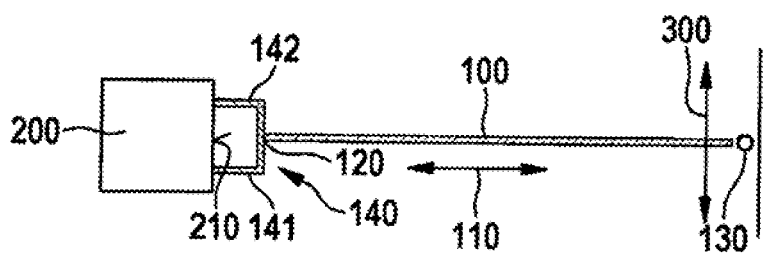
FIG. 2 shows a micromechanical spring structure according to the present invention, including a spring beam and a rigid micromechanical structure in a first exemplary embodiment.

FIG. 2 shows a micromechanical spring structure according to the present invention, including a spring beam and a rigid micromechanical structure in a first exemplary embodiment. Unlike the spring structure in the related art shown in FIG. 1, first end 120 of spring beam 100 includes a fork 140 having two support arms 141, 142, which are anchored to rigid micromechanical structure 200. In this configuration, two support arms 141, 142 are anchored to surface 210 of rigid micromechanical structure 200, which extends perpendicular to main extension direction 110 of spring beam 100.

Rigid micromechanical structure 200 may be a substrate anchor. Rigid micromechanical structure 200 may also be a moveable structure, in particular, a seismic mass. A fork 140 may be situated not only on the first end, but additionally or alternatively also on the second end of the spring beam.

The fork according to FIG. 2 forms a frame or a frame structure. The frame structure is inserted in a micromechanical sensor between the substrate anchor and the spring structure or also between the spring structure and the mass structure. In the example of FIG. 2, the frame structure is introduced between the substrate anchor and the spring structure. The fork 140 forms a rectangular frame. The side lengths and widths of the frame are to be appropriately adjusted in order to optimally reduce the non-linearity. Lateral tensile forces are compensated for by the bending of the frame. The bend is small in proportion to the deflection of the spring structure. The frame structure may be dimensioned in such a way that a corresponding degree of non-linearity is reduced. With a frame size of 10×20 $\mu m^2$, for example, the non-linearity is reduced by more than 50% in a beam 800 µm in length clamped on both sides. This involves simulation results. The first normal mode of the frame is at 100 times the fundamental oscillation.

Figure 3:
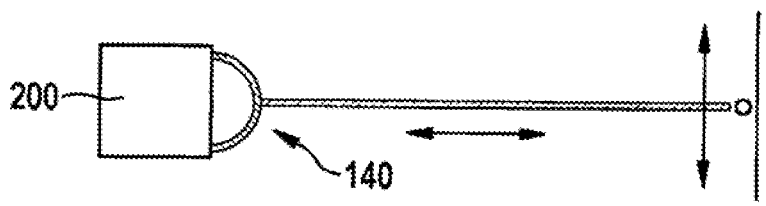
FIG. 3 shows a micromechanical spring structure according to the present invention, including a spring beam and a rigid micromechanical structure in a second exemplary embodiment.

FIG. 3 shows a micromechanical spring structure according to the present invention, including a spring beam and a rigid micromechanical structure in a second exemplary embodiment. Alternatively to the first exemplary embodiment, fork 140 forms a semicircular frame or an elliptical frame.

Figure 4:
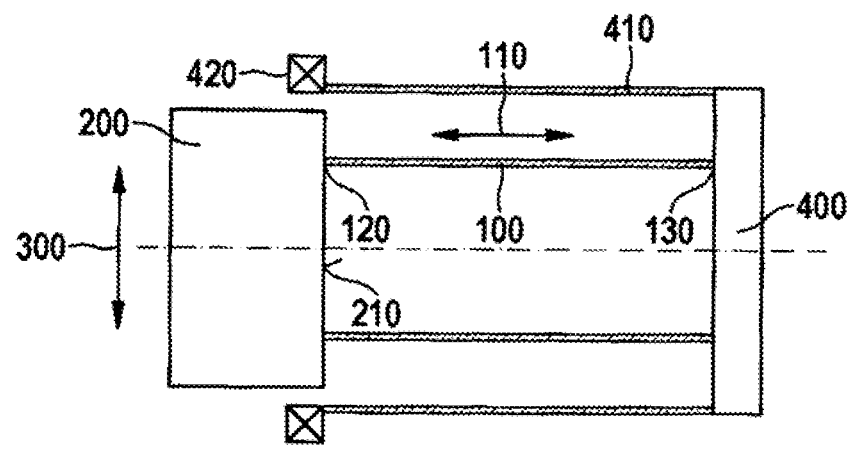
FIG. 4 shows a second micromechanical spring structure, including a spring beam and a rigid micromechanical structure in the related art.

FIG. 4 shows a second micromechanical spring structure, including a spring beam and a rigid micromechanical structure in the related art. Spring beam 100 includes a first end 120 and an opposing second end 130 along a main extension direction 110. First end 120 of spring beam 100 is anchored to a surface 210 of rigid micromechanical structure 200, which is configured as a moveable structure. Surface 210 extends perpendicular to main extension direction 110 of the spring beam. First end 120 of spring beam 100, together with rigid micromechanical structure 200, is deflectable in a direction 300, which extends in parallel to surface 210. Spring beam 100 bends as a result. Rigid micromechanical structure 200 is configured as a seismic mass and essentially does not deform. Second end 130 of spring beam 100 is connected to a suspension beam 400. Suspension beam 400 essentially does not deform. Suspension beam 400, in turn, is connected to an end of an additional spring beam 410. Another opposing end of additional spring beam 410 is connected to a substrate anchor 420. Additional spring beam 410 extends in parallel to spring beam 100. A mirror image of this structure is repeated on the plotted symmetry axis (dotted-dashed line) in parallel to main extension direction 110 of spring beam 100. The structure is referred to below as a double-folded beam structure DFBS.

Figure 5:
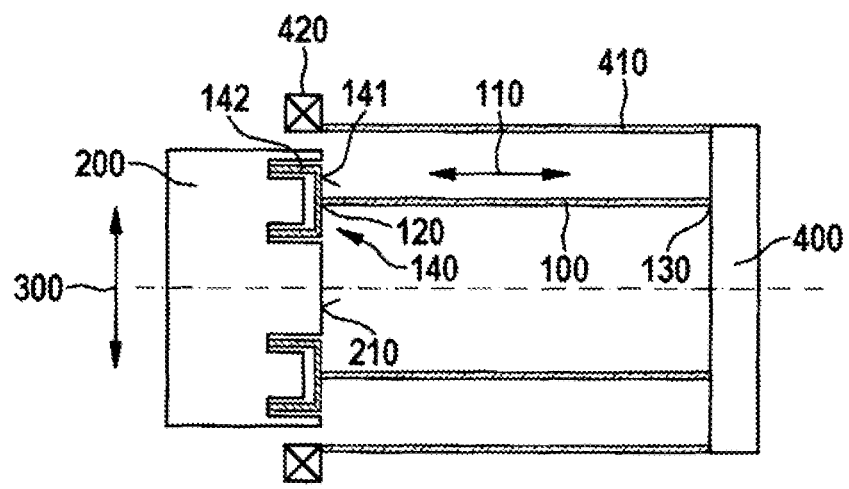
FIG. 5 shows a micromechanical spring structure according to the present invention, including a spring beam and a rigid micromechanical structure in a third exemplary embodiment.

FIG. 5 shows a micromechanical spring structure according to the present invention, including a spring beam and a rigid micromechanical structure in a third exemplary embodiment. Unlike the spring structure in the related art shown in FIG. 1, first end 120 of spring beam 100 includes a fork 140 having two support arms 141, 142, which is anchored to rigid micromechanical structure 200. In this configuration, two support arms 141, 142 are anchored to surface 210 of rigid micromechanical structure 200, which extends perpendicular to main extension direction 110 of spring beam 100.

Fork 140 according to FIG. 5 forms a frame or a frame structure. The frame structure is situated between the mass element and the spring structure. A dimension of the DFBS of 180×150 µm and a frame size of 10×20 µm² result in a reduction of the non-linearity of 30%. This involves simulation results.

The frame in the present exemplary embodiment is filled out by rigid micromechanical structure 200 at a certain distance from support arms 141, 142, or the frame is countersunk in recesses in rigid micromechanical structure 200. This serves the purpose of optimally utilizing the present installation space by increasing the extension and, therefore, the mass of fixed rigid micromechanical structure 200 without adversely affecting the function of fork 140 in the process.

The List of Reference Numerals is as follows:

| | |
|---|---|
| 100 | spring beam |
| 110 | main extension direction |
| 120 | first end |
| 130 | second end |
| 140 | fork |
| 141 | first support arm |
| 142 | second support arm |
| 200 | rigid micromechanical structure |
| 210 | surface of the rigid micromechanical structure |
| 300 | direction of a deflection |
| 400 | suspension beam |
| 410 | additional spring beam |
| 420 | substrate anchor |

What is claimed is:

1. A micromechanical device comprising:
a substrate; and
a spring structure that includes:
a rigid micromechanical structure; and
a first spring that includes:
a base elastic extension that extends, in a main extension direction, from a first end of the first spring to a second end of the first spring; and
at the second end of the first spring, two support arms into which the base elastic extension of the first spring branches and that are anchored directly to a surface of one side of the rigid micromechanical structure, the surface extending perpendicularly to the main extension directions;
wherein:
(1) the rigid micromechanical structure, to the surface of which the two support arms are directly anchored, is a substrate anchor that is directly and immovably connected to the substrate;
(2) the micromechanical device is a rotation rate sensor, the rigid micromechanical structure, to the surface of which the two support arms are directly anchored, is a movable mass that is movably connected to the substrate via the spring structure, and the spring structure further includes a second spring that includes:
a base elastic extension that extends, in the main extension direction, from a first end of the second spring to a second end of the second spring; and
at the second end of the second spring, two support arms into which the base elastic extension of the second spring branches and that are anchored directly to the surface of the rigid micromechanical structure; and/or
(3) the surface of the rigid micromechanical structure includes a protrusion that protrudes, parallel to the main extension direction, from between respective connection points at which respective ones of the two supports arms of the first spring connect to the rigid micromechanical structure into an area between the two support arms of the first spring.

2. The micromechanical device of claim 1, wherein the rigid micromechanical structure is the substrate anchor.

3. The micromechanical device of claim 2, wherein the two support arms form a semicircular frame or an elliptical frame.

4. The micromechanical device of claim 2, wherein the two support arms and a connection of the two support arms to the base elastic extension form a rectangular frame.

5. The micromechanical device of claim 1, wherein the micromechanical device is the rotation rate sensor, the rigid micromechanical structure is the movable mass that is movably connected to the substrate via the spring structure, and the spring structure further includes the second spring.

6. The micromechanical device of claim 5, wherein the two support arms form a semicircular frame or an elliptical frame.

7. The micromechanical device of claim 5, wherein the two support arms and a connection of the two support arms to the base elastic extension form a rectangular frame.

8. The micromechanical device of claim 5, wherein the movable mass is a seismic mass.

9. The micromechanical device of claim 5, wherein the surface of the rigid micromechanical structure includes the protrusion that protrudes, parallel to the main extension direction, from between the respective connection points at which the respective ones of the two supports arms of the first spring connect to the rigid micromechanical structure into the area between the two support arms of the first spring.

10. The micromechanical device of claim 1, wherein the two support arms and a connection of the two support arms to the base elastic extension form a rectangular frame.

11. The micromechanical device of claim 1, wherein the two support arms form a semicircular frame or an elliptical frame.

12. The micromechanical device of claim 1, wherein the surface of the rigid micromechanical structure includes a protrusion that protrudes, parallel to the main extension direction, from between respective connection points at which respective ones of the two supports arms of the first spring connect to the rigid micromechanical structure into an area between the two support arms of the first spring.

* * * * *